United States Patent
Shim et al.

(10) Patent No.: US 10,566,488 B2
(45) Date of Patent: Feb. 18, 2020

(54) SOLAR CELL AND METHOD FOR MANUFACTURING THE SAME

(71) Applicant: LG ELECTRONICS INC., Seoul (KR)

(72) Inventors: Seunghwan Shim, Seoul (KR); Ilhyoung Jung, Seoul (KR); Indo Chung, Seoul (KR); Eunhye Youn, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 344 days.

(21) Appl. No.: 14/811,475

(22) Filed: Jul. 28, 2015

(65) Prior Publication Data
US 2016/0027951 A1 Jan. 28, 2016

(30) Foreign Application Priority Data
Jul. 28, 2014 (KR) .................. 10-2014-0095993

(51) Int. Cl.
*H01L 31/0224* (2006.01)
*H01L 31/18* (2006.01)
(Continued)

(52) U.S. Cl.
CPC .......... *H01L 31/077* (2013.01); *H01L 31/028* (2013.01); *H01L 31/022425* (2013.01);
(Continued)

(58) Field of Classification Search
CPC ....... H01L 31/00; H01L 31/02; H01L 31/186; H01L 31/1864; H01L 31/1868;
(Continued)

(56) References Cited

U.S. PATENT DOCUMENTS 7,468,485 B1   12/2008  Swanson
2007/0256728 A1  11/2007  Cousins
(Continued)

FOREIGN PATENT DOCUMENTS

CN  101777603 A   7/2010
JP  2013-516082 A  5/2013
(Continued)

OTHER PUBLICATIONS

Bock et al., "Back-junction back-contact n-type silicon solar cells with screen-printed aluminum-alloyed emitter," Applied Physics Letters, vol. 96, No. 26, 2010 (published online Jun. 28, 2010), XP12131787A, pp. 263507-1-263507-3.
(Continued)

*Primary Examiner* — Christina Chern
(74) *Attorney, Agent, or Firm* — Birch, Stewart, Kolasch & Birch, LLP (57) ABSTRACT

A solar cell and a method for manufacturing the same are disclosed. The solar cell includes a semiconductor substrate doped with impurities of a first conductive type, a front surface field region disposed at a front surface of the substrate and doped with impurities of the first conductive type at a concentration higher than those of the substrate, a tunnel layer disposed on a back surface of the substrate and formed of a dielectric material, an emitter region disposed at a first portion of a back surface of the tunnel layer and doped with impurities of a second conductive type opposite the first conductive type, and a back surface field region disposed at a second portion of the back surface of the tunnel layer and doped with impurities of the first conductive type at a concentration higher than those of the substrate.

10 Claims, 9 Drawing Sheets

(51) Int. Cl.
*H01L 31/077* (2012.01)
*H01L 31/028* (2006.01)
*H01L 31/0368* (2006.01)
*H01L 31/0352* (2006.01)
*H01L 31/0747* (2012.01)

(52) U.S. Cl.
CPC ........ *H01L 31/022441* (2013.01); *H01L 31/03682* (2013.01); *H01L 31/035272* (2013.01); *H01L 31/0747* (2013.01); *H01L 31/182* (2013.01); *H01L 31/1804* (2013.01); *H01L 31/186* (2013.01); *Y02E 10/547* (2013.01); *Y02P 70/521* (2015.11)

(58) Field of Classification Search
CPC ......... H01L 31/0224; H01L 31/022425; H01L 31/022433; H01L 31/022441
See application file for complete search history.

(56) References Cited

U.S. PATENT DOCUMENTS

| | | |
|---|---|---|
| 2011/0041902 A1* | 2/2011 | Krokoszinski ................ H01L 31/022441 136/255 |
| 2011/0041911 A1* | 2/2011 | Lee ................. H01L 31/022425 136/256 |
| 2012/0073650 A1 | 3/2012 | Smith et al. |
| 2012/0211063 A1 | 8/2012 | Lee et al. |
| 2012/0282732 A1 | 11/2012 | Jeon et al. |
| 2012/0322199 A1 | 12/2012 | Graff |
| 2013/0213469 A1* | 8/2013 | Kramer .......... H01L 31/022458 136/256 |
| 2014/0090701 A1 | 4/2014 | Rim et al. |
| 2014/0096821 A1 | 4/2014 | Chen et al. |
| 2014/0170800 A1 | 6/2014 | Loscutoff et al. |

FOREIGN PATENT DOCUMENTS

| | | |
|---|---|---|
| KR | 10-2009-0009224 A | 1/2009 |
| WO | WO 2014/051646 A1 | 4/2014 |

OTHER PUBLICATIONS

Keding et al., "Co-Diffused Back-Contact Back-Junction Silicon Solar Cells without Gap Regions," IEEE Journal of Photovoltaics, vol. 3, No. 4, Oct. 2013 (date of current version Sep. 18, 2013), XP11527236A, pp. 1236-1242.

Ohrdes et al., "High Fill-Factors of Back-Junction Solar Cells without Front Surface Field Diffusion," 27th European Photovoltaic Solar Energy Conference and Exhibition, Oct. 31, 2012, XP40634154A, pp. 866-869.

Posthuma et al., "Development and Analysis of Small Area High Efficiency Interdigitated Back Contact Silicon Solar Cells," 27th European Photovoltaic Solar Energy Conference and Exhibition, Oct. 31, 2012, XP40633811A, pp. 571-575.

Bock et al., "Back-Junction Back-Contact n-type Silicon Solar Cells with Screen-Printed Aluminum-Alloyed Emitter," Applied Physics Letters, vol. 96, No. 26, 2010 (published online Jun. 28, 2010), pp. 263507-1-263507-3.

* cited by examiner

SOLAR CELL AND METHOD FOR MANUFACTURING THE SAME

CROSS-REFERENCE TO RELATED APPLICATION

This application claims priority to and the benefit of Korean Patent Application No. 10-2014-0095993 filed in the Korean Intellectual Property Office on Jul. 28, 2014, the entire contents of which are incorporated herein by reference.

BACKGROUND OF THE INVENTION

Field of the Invention

Embodiments of the invention relate to a solar cell and a method for manufacturing the same.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type and thus form a p-n junction, and electrodes respectively connected to the semiconductor parts of the different conductive types.

When light is incident on the solar cell, a plurality of electron-hole pairs are produced in the semiconductor parts and are separated into electrons and holes. The electrons move to the n-type semiconductor part, and the holes move to the p-type semiconductor part. Then, the electrons and the holes are collected by the different electrodes respectively connected to the n-type semiconductor part and the p-type semiconductor part. The electrodes are connected to each other using electric wires to thereby obtain electric power.

SUMMARY OF THE INVENTION

In one aspect, there is a solar cell including a semiconductor substrate doped with impurities of a first conductive type, a front surface field region disposed at a front surface of the semiconductor substrate and doped with impurities of the first conductive type at a concentration higher than those of the semiconductor substrate, a tunnel layer disposed on a back surface of the semiconductor substrate and formed of a dielectric material, an emitter region disposed at a first portion of a back surface of the tunnel layer and doped with impurities of a second conductive type opposite the first conductive type, a back surface field region disposed at a second portion of the back surface of the tunnel layer and doped with impurities of the first conductive type at a concentration higher than those of the semiconductor substrate, a first electrode connected to the emitter region, and a second electrode connected to the back surface field region, wherein a ratio of resistances of the front surface field region and the back surface field region is 10:1 to 3:1.

The back surface field region may have a resistance of 45Ω to 300Ω per unit area, and the front surface field region may have a resistance of 450Ω to 900Ω per unit area.

The first conductive type may be an n-type, and a thickness of the back surface field region may be less than a thickness of the emitter region.

A difference between the thickness of the back surface field region and the thickness of the emitter region may be 50 nm to 100 nm. More specifically, the thickness of the emitter region may be 200 nm to 300 nm, and the thickness of the back surface field region may be 100 nm to 250 nm.

On the contrary, if the first conductive type is a p-type, the thickness of the back surface field region may be greater than the thickness of the emitter region.

The emitter region and the back surface field region may be separated from each other. An intrinsic semiconductor layer formed of polycrystalline silicon material may be disposed in a separation space between the emitter region and the back surface field region at the back surface of the tunnel layer.

The intrinsic semiconductor layer may have a thickness between a thickness of the back surface field region and a thickness of the emitter region.

The dielectric material of the tunnel layer may include silicon carbide (SiC) and silicon oxide (SiOx). In addition, the tunnel layer may be formed of silicon nitride (SiNx), hydrogenated SiNx, aluminum oxide (AlOx), silicon oxynitride (SiON), or hydrogenated SiON. The tunnel layer may have a thickness of 0.5 nm to 2.5 nm.

In another aspect, there is a method for manufacturing a solar cell including depositing a tunnel layer formed of a dielectric material and an intrinsic semiconductor layer on a back surface of a semiconductor substrate containing impurities of a first conductive type; implanting impurities of a second conductive type opposite the first conductive type into a first area of the intrinsic semiconductor layer; forming a diffusion barrier layer on the first area of the intrinsic semiconductor layer; a thermal diffusion operation for thermally diffusing a doping source containing impurities of the first conductive type in a second area of the intrinsic semiconductor layer, in which the diffusion barrier layer is not formed, and at the same time a front surface of the semiconductor substrate to simultaneously form a front surface field region at the front surface of the semiconductor substrate and a back surface field region and an emitter region at the intrinsic semiconductor layer; an etching operation for simultaneously etching the front surface and the back surface of the semiconductor substrate to partially etch a surface of the front surface field region and a surface of the back surface field region, and at the same time to remove the diffusion barrier layer formed on the emitter region; and forming a first electrode on the emitter region and forming a second electrode on the back surface field region.

The forming of the diffusion barrier layer may include a diffusion barrier layer deposition operation for depositing the diffusion barrier layer on an entire back surface of the intrinsic semiconductor layer including the first area of the intrinsic semiconductor layer, and a back surface field region pattern formation operation for etching the diffusion barrier layer formed on the second area except the first area of the intrinsic semiconductor layer to form a pattern for the back surface field region.

The first area of the intrinsic semiconductor layer and the second area of the intrinsic semiconductor layer, in which the diffusion barrier layer is etched, may be separated from each other.

In the diffusion barrier layer deposition operation, the diffusion barrier layer formed of silicon carbide (SiC) may be deposited.

In the back surface field region pattern formation operation, the diffusion barrier layer formed on the second area of the intrinsic semiconductor layer may be etched by irradiating a laser beam.

In the thermal diffusion operation, impurities of the second conductive type implanted into the first area of the intrinsic semiconductor layer may be thermally diffused and may be formed as the emitter region formed of polycrystalline silicon material.

The diffusion barrier layer formed of silicon carbide (SiC) is oxidized to silicon oxide (SiOx) through the thermal diffusion operation.

A by-product being one of phosphosilicate glass (PSG) or borosilicate glass (BSG) generated in the front surface field region and the back surface field region in the thermal diffusion operation may be removed in the etching operation.

In the etching operation, an etching rate of the front surface field region may be greater than an etching rate of the back surface field region.

A ratio of resistances of the front surface field region and the back surface field region through the etching operation may be 10:1 to 3:1.

A thickness of the back surface field region may be different from a thickness of the emitter region through the etching operation.

More specifically, if the first conductive type is an n-type, a thickness of the back surface field region may be less than a thickness of the emitter region through the etching operation. Alternatively, if the first conductive type is a p-type, the thickness of the back surface field region may be greater than the thickness of the emitter region through the etching operation.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be paid attention that a detailed description of known arts will be omitted if it is determined that the description of the known arts can lead to misconstruing of the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on other element, it may be on the entire surface of the other element and may not be on a portion of an edge of the other element.

In the following description, "front surface" may be one surface of a semiconductor substrate, on which light is directly incident, and "back surface" may be a surface opposite the one surface of the semiconductor substrate, on which light is not directly incident or reflective light may be incident.

FIGS. 1 to 4 illustrate a solar cell according to a first embodiment of the invention.

Figure 1:
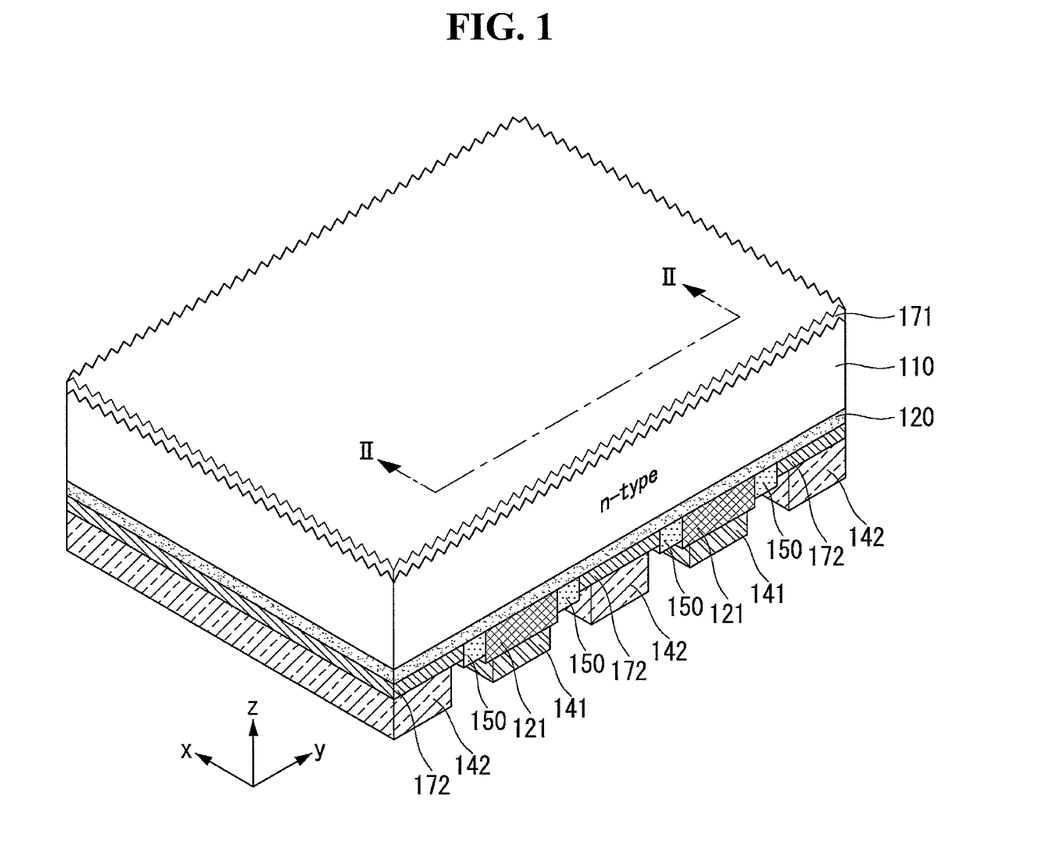
FIGS. 1 to 4 illustrate a solar cell according to a first embodiment of the invention.
Figure 2:
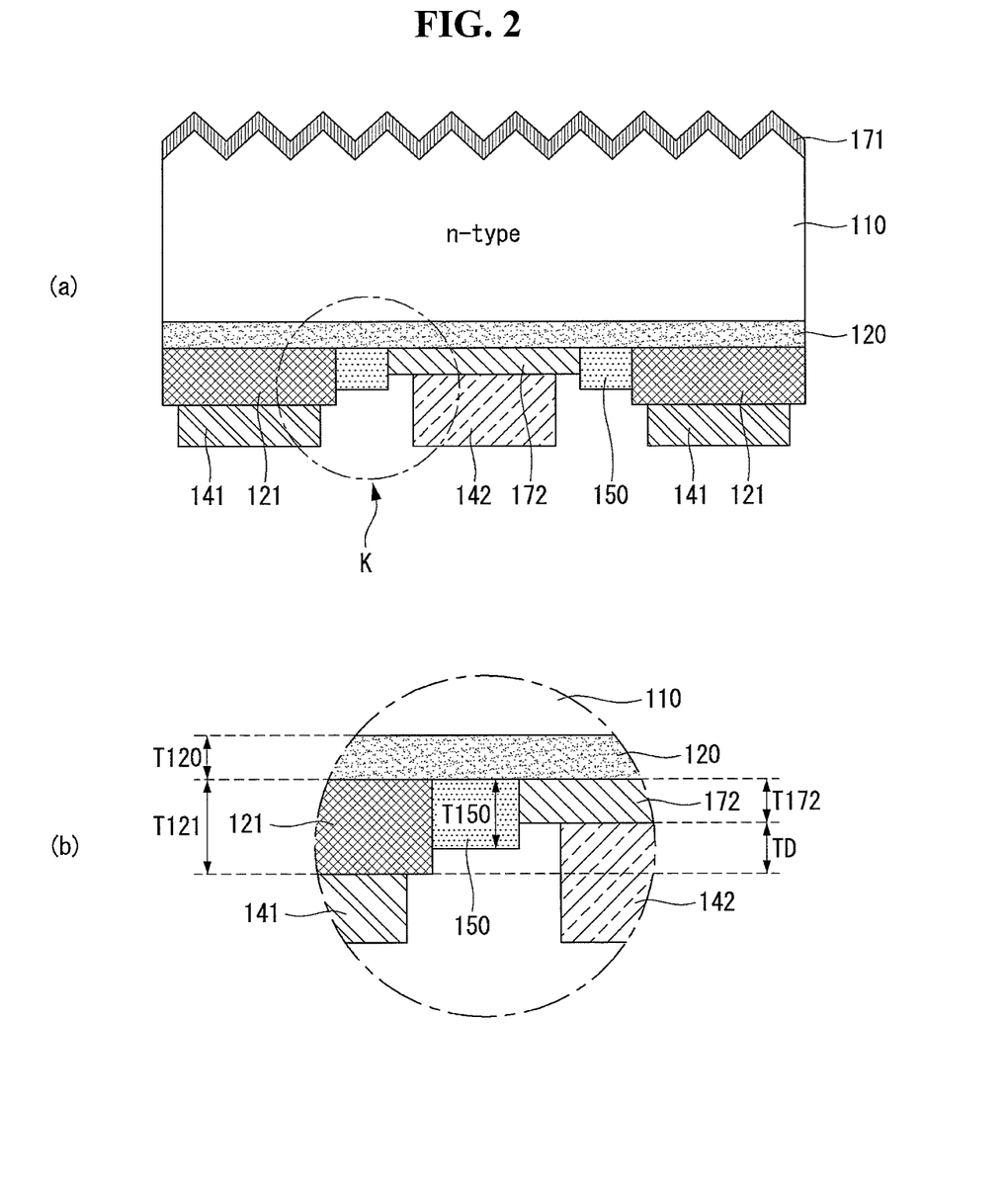
Figure 3:
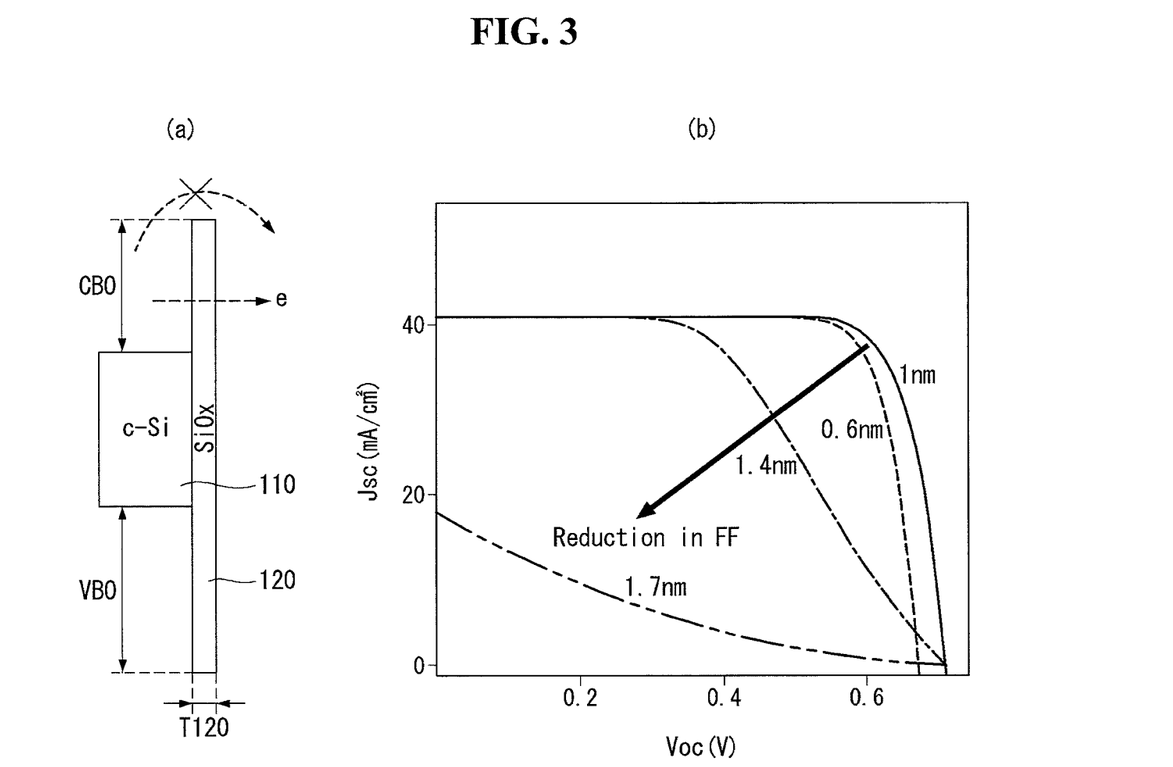
Figure 4:
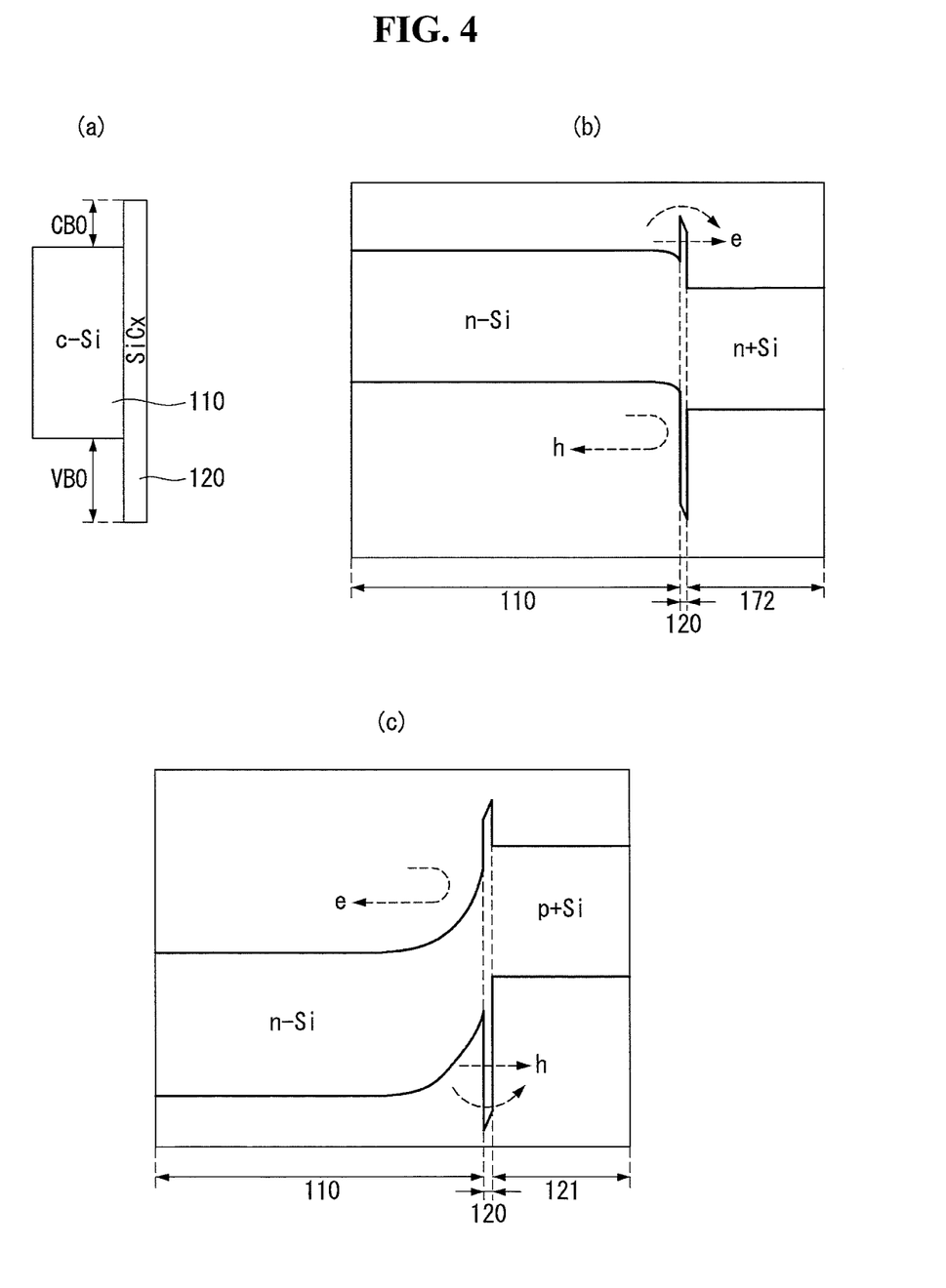

More specifically, FIG. 1 is a partial perspective view of the solar cell according to the first embodiment of the invention. In FIG. 2, (a) is a cross-sectional view taken along line II-II of FIG. 1, and (b) is an enlarged view of a portion K in (a) of FIG. 2. FIGS. 3 and 4 show a tunnel layer shown in FIGS. 1 and 2.

As shown in FIG. 1 and (a) of FIG. 2, the solar cell according to the first embodiment of the invention may include a semiconductor substrate 110, a front surface field region 171, a tunnel layer 120, an emitter region 121, a back surface field region 172, an intrinsic semiconductor layer 150, a first electrode 141, and a second electrode 142.

An anti-reflection layer may be further formed on the front surface field region 171.

FIG. 1 and (a) of FIG. 2 show that the solar cell includes the tunnel layer 120 and the intrinsic semiconductor layer 150, as an example. Therefore, they may be omitted, if desired or necessary. However, when the solar cell includes the tunnel layer 120 and the intrinsic semiconductor layer 150 as shown in FIG. 1 and (a) of FIG. 2, efficiency of the solar cell may be further improved. Thus, the embodiment of the invention is described using the solar cell including the tunnel layer 120 and the intrinsic semiconductor layer 150 as an example.

The embodiment of the invention may simplify a method for manufacturing the solar cell while satisfactorily maintaining power generation efficiency of the solar cell having the above-described structure. Namely, the solar cell having the structure shown in FIG. 1 and (a) of FIG. 2 may be manufactured through a method for manufacturing the solar cell to be described with reference to FIGS. 6 to 12. The method for manufacturing the solar cell to be described in FIGS. 6 to 12 may be simply performed by simultaneously forming the front surface field region 171 and the back surface field region 172 of the solar cell using the same doping source. The method for manufacturing the solar cell according to the embodiment of the invention will be described after the structure of the solar cell according to the embodiment of the invention is described in detail.

The semiconductor substrate 110 may be formed of single crystal silicon material doped with impurities of a first conductive type, for example, n-type impurities, though not required. When the semiconductor substrate 110 is of the n-type, the semiconductor substrate 110 may be doped with impurities of a group V element such as phosphorus (P), arsenic (As), and antimony (Sb).

Alternatively, the semiconductor substrate 110 may be of a p-type and/or may be formed of a semiconductor material other than silicon. If the semiconductor substrate 110 is of the p-type, the semiconductor substrate 110 may be doped with impurities of a group III element such as boron (B), gallium (Ga), and indium (In).

An incident surface of the semiconductor substrate 110 may be textured to form a textured surface corresponding to an uneven surface having a plurality of uneven portions or having uneven characteristics. FIG. 1 shows that only edges of the semiconductor substrate 110 have the textured surface for the sake of brevity and ease of reading. However, an entire front surface of the semiconductor substrate 110 substantially has the textured surface, and thus the front surface field region 171 positioned on the front surface of the semiconductor substrate 110 may have the textured surface.

As shown in FIG. 1, the front surface field region 171 is positioned at the front surface of the semiconductor substrate 110 and may be formed of single crystal silicon material containing impurities of the first conductive type at a concentration higher than the semiconductor substrate 110.

A potential barrier is formed by a difference between impurity concentrations of the semiconductor substrate 110 and the front surface field region 171. Hence, the front surface field region 171 may have a field effect preventing carriers (for example, holes) from moving to the front surface of the semiconductor substrate 110 through the potential barrier.

Further, the front surface field region 171 may increase an output amount of carriers output to an external device and may reduce an amount of carriers lost by a recombination and/or a disappearance of carriers at and around the front surface of the semiconductor substrate 110.

The front surface field region 171 may include hydrogen (H). In this instance, the front surface field region 171 including hydrogen (H) may perform a passivation function, which converts a defect, for example, dangling bonds existing at and around the front surface of the semiconductor substrate 110 into stable bonds and prevents or reduces carrier from being lost by the defect at and around the front surface of the semiconductor substrate 110.

The front surface field region 171 may be formed in the same chamber using the same doping gas as the back surface field region 172 at the same time as the formation of the back surface field region 172. This will be described in detail later.

The tunnel layer 120 is positioned on a back surface of the semiconductor substrate 110 and may include a dielectric material. More specifically, the tunnel layer 120 may be formed on the entire back surface of the semiconductor substrate 110. The tunnel layer 120 may pass through carriers produced in the semiconductor substrate 110 and may perform a passivation function at the back surface of the semiconductor substrate 110.

The tunnel layer 120 may be formed of the dielectric material, for example, silicon carbide (SiC) and silicon oxide (SiOx). In addition, the tunnel layer 120 may be formed of silicon nitride (SiNx), hydrogenated SiNx, aluminum oxide (AlOx), silicon oxynitride (SiON), or hydrogenated SiON.

When the tunnel layer 120 is formed of SiOx, a thickness T120 of the tunnel layer 120 may be 0.8 nm to 1.2 nm because there is a large band offset voltage difference between the semiconductor substrate 110 and the tunnel layer 120. Further, when the tunnel layer 120 is formed of SiC, the thickness T120 of the tunnel layer 120 may be 0.5 nm to 2.5 nm because the band offset voltage difference between the semiconductor substrate 110 and the tunnel layer 120 relatively decreases. This is described in detail with reference to FIGS. 3 and 4.

The emitter region 121 is positioned at a portion of a back surface of the tunnel layer 120 in the plural and extends in a predetermined direction. The plurality of emitter regions 121 may be formed of polycrystalline silicon material of a second conductive type opposite the first conductive type and may form a p-n junction along with the semiconductor substrate 110 with the tunnel layer 120 interposed therebetween.

Accordingly, carriers, for example, electron-hole pairs produced by light incident on the semiconductor substrate 110 are separated into electrons and holes by the p-n junction between the semiconductor substrate 110 and the plurality of emitter regions 121. The separated electrons move to the n-type semiconductor, and the separated holes move to the p-type semiconductor. When the semiconductor substrate 110 is of the n-type and the emitter regions 121 are of the p-type, the separated holes may move to the plurality of emitter regions 121, and the separated electrons may move to the plurality of back surface field regions 172 having an impurity concentration higher than the semiconductor substrate 110.

Because each emitter region 121 forms the p-n junction along with the semiconductor substrate 110, the emitter region 121 may be of the n-type if the semiconductor substrate 110 is of the p-type unlike the embodiment described above. In this instance, the separated electrons may move to the plurality of emitter regions 121, and the separated holes may move to the plurality of back surface field regions 172.

Returning to the embodiment of the invention, when the emitter regions 121 are of the p-type, the emitter regions 121 may be doped with impurities of a group III element such as B, Ga, and In. On the contrary, if the emitter regions 121 are of the n-type, the emitter regions 121 may be doped with impurities of a group V element such as P, As, and Sb.

The emitter regions 121 may be formed by forming the intrinsic semiconductor layer 150 of polycrystalline material at the back surface of the semiconductor substrate 110 and then implanting impurities of the second conductive type into the intrinsic semiconductor layer 150 of the polycrystalline material.

The plurality of back surface field regions 172 may be positioned at a portion of the back surface of the tunnel layer 120, at which the plurality of emitter regions 121 are not formed, and may extend in the same direction as the emitter regions 121. The back surface field regions 172 may be formed of polycrystalline silicon material doped with impurities of the first conductive type at a concentration higher than the semiconductor substrate 110.

Thus, when the semiconductor substrate 110 is doped with, for example, n-type impurities, the plurality of back surface field regions 172 may be an $n^+$-type region.

The back surface field regions 172 may be formed in the same chamber using the same doping gas as the front surface field region 171 at the same time as the formation of the front surface field region 171. This will be described in detail when the method for manufacturing the solar cell is described with reference to FIGS. 6 to 12.

A potential barrier is formed by a difference between impurity concentrations of the semiconductor substrate 110 and the back surface field regions 172. Hence, the back surface field regions 172 prevent or reduce holes from moving to the back surface field regions 172 used as a moving path of electrons through the potential barrier and makes it easier for electrons to move to the back surface field regions 172. Thus, the back surface field regions 172 reduce an amount of carriers lost by a recombination and/or a disappearance of electrons and holes at and around the back surface field regions 172 or the first and second electrodes 141 and 142 and accelerates a movement of electrons, thereby increasing the movement of electrons to the back surface field regions 172.

The back surface field regions 172 may adjoin the emitter regions 121. On the contrary, as shown in FIG. 1 and (a) of FIG. 2, the back surface field regions 172 may be separated from the emitter regions 121.

When the back surface field region 172 is separated from the emitter region 121 as described above, the intrinsic semiconductor layer 150 may be disposed between the emitter region 121 and the back surface field region 172. In this embodiment of the invention, the intrinsic semiconductor layer 150 may contact the tunnel layer 120, the emitter region 121 and the back surface field region 172. Also, a groove may be present between the intrinsic semiconductor layer 150 and the second electrode 142.

The intrinsic semiconductor layer 150 may be formed of polycrystalline silicon material in a separation space between the emitter region 121 and the back surface field region 172 at the back surface of the tunnel layer 120. The intrinsic semiconductor layer 150 may be an intrinsic layer, which is not doped with the p-type or n-type impurities unlike the emitter region 121 and the back surface field region 172.

The first electrode 141 may be in the plural. The plurality of first electrodes 141 may be respectively positioned on the plurality of emitter regions 121, may extend along the emitter regions 121, and may be electrically and physically connected to the emitter regions 121. Thus, each first electrode 141 may collect carriers (for example, holes) moving to the corresponding emitter region 121.

The second electrode 142 may be in the plural. The plurality of second electrodes 142 may be respectively positioned on the plurality of back surface field regions 172, may extend along the back surface field regions 172, and may be electrically and physically connected to the back surface field regions 172. Thus, each second electrode 142 may collect carriers (for example, electrons) moving to the corresponding back surface field regions 172.

The plurality of first and second electrodes 141 and 142 may be formed of a conductive metal material. For example, the plurality of first and second electrodes 141 and 142 may be formed of at least one conductive material selected from the group consisting of nickel (Ni), copper (Cu), silver (Ag), aluminum (Al), tin (Sn), zinc (Zn), indium (In), titanium (Ti), gold (Au), and a combination thereof. Alternatively, the plurality of first and second electrodes 141 and 142 may be formed of a transparent conductive metal, for example, transparent conductive oxide (TCO).

An operation of the solar cell having the above-described structure is described below.

When light irradiated to the solar cell is incident on the semiconductor substrate 110, a plurality of electron-hole pairs are generated in the semiconductor substrate 110 by light energy produced based on the incident light. The electron-hole pairs are separated into electrons and holes by the p-n junction of the semiconductor substrate 110 and the emitter regions 121. The electrons move to the n-type back surface field regions 172, and the holes move to the p-type emitter regions 121. The holes moving to the emitter regions 121 are transferred to the first electrodes 141 and then are collected by the first electrodes 141. The electrons moving to the back surface field regions 172 are transferred to the second electrodes 142 and then are collected by the second electrodes 142. When the first electrodes 141 and the second electrodes 142 are connected to each other using conductive wires, current flows therein to thereby enable use of the current for electric power.

In the solar cell according to the embodiment of the invention, a ratio of resistances of the front surface field region 171 and the back surface field region 172 may be 10:1 to 3:1.

For example, the front surface field region 171 may have a resistance of 450Ω to 900Ω per unit area, and the back surface field region 172 may have a resistance of 45Ω to 300Ω per unit area within the above range.

When the ratio of resistances of the front surface field region 171 and the back surface field region 172 is 10:1 to 3:1, the front surface field region 171 and the back surface field region 172 properly performing a field function may be respectively formed at the front surface and the back surface of the semiconductor substrate 110. Further, when the resistance of the front surface field region 171 is excessively reduced because of an excessive amount of impurities doped on the front surface field region 171, an amount of light absorbed in the front surface field region 171 may increase. However, in the embodiment of the invention, because the resistance of the front surface field region 171 is greater than the resistance of the back surface field region 172 but is limited within the above range, an amount of light absorbed in the front surface field region 171 may be minimized.

In other words, the resistance of the front surface field region 171 or the back surface field region 172 may be determined depending on a doping amount of impurities of the first conductive type. For example, when the resistance of the front surface field region 171 is less than 450Ω per unit area, surface recombination characteristics may excessively increase because of an excessive doping amount of impurities, and an amount of absorbed light may decrease. When the resistance of the front surface field region 171 is greater than 900Ω per unit area, the field effect of the front surface field region 171 may be very weak because of a small doping amount of impurities, and a surface passivation function of the front surface field region 171 may be reduced. Hence, the reliability of the solar cell may be reduced.

The resistance of the front surface field region 171 or the back surface field region 172 may be adjusted by doping the front surface field region 171 or the back surface field region 172 with impurities of the first conductive type and then partially etching the surface of the front surface field region 171 or the back surface field region 172.

As shown in (b) of FIG. 2, in the solar cell according to the embodiment of the invention, a thickness T121 of the emitter region 121 may be different from a thickness T172 of the back surface field region 172.

A reason to generate a thickness difference between the emitter region 121 and the back surface field region 172 is as follows. In the method for manufacturing the solar cell according to the embodiment of the invention, impurities of the second conductive type are implanted into the emitter region 121, and impurities of the first conductive type are implanted into the back surface field region 172. Then, the back surface field region 172 and the emitter region 121 are etched, so as to remove by-products, for example, phosphosilicate glass (PSG) or borosilicate glass (BSG) formed at the surface of the back surface field region 172 and to remove an oxide layer formed at the surface of the emitter region 121. In this instance, the n-type component collecting electrons is relatively etched more than the p-type component collecting holes.

Thus, as shown in (b) of FIG. 2, when impurities of the first conductive type doped on the back surface field region 172 are n-type impurities, the back surface field region 172 may be etched more than the emitter region 121. Hence, the thickness T172 of the back surface field region 172 may be less than the thickness T121 of the emitter region 121.

For example, a thickness difference TD between the emitter region 121 and the back surface field region 172 may be 50 nm to 100 nm. Thus, the thickness T121 of the emitter region 121 may be 200 nm to 300 nm, and the thickness T172 of the back surface field region 172 may be 100 nm to 250 nm within the range less than the thickness T121 of the emitter region 121.

On the contrary, when impurities of the first conductive type doped on the back surface field region 172 are p-type impurities, the emitter region 121 may be etched more than the back surface field region 172. Hence, the thickness T121 of the emitter region 121 may be less than the thickness T172 of the back surface field region 172, unlike (b) of FIG. 2. This is described in detail later with reference to FIG. 5.

Further, as shown in (b) of FIG. 2, the intrinsic semiconductor layer 150 may have a thickness T150 between the thickness T172 of the back surface field region 172 and the thickness T121 of the emitter region 121.

The tunnel layer 120 may be formed of a dielectric material (for example, SiC or SiOx) having strong durability even at a high temperature equal to or higher than 600° C. Alternatively, if the tunnel layer 120 is formed of a material including amorphous silicon, a desired tunneling effect cannot be obtained from the tunnel layer 120 because amorphous silicon is weak at the high temperature equal to or higher than 600° C.

As described above, when the tunnel layer 120 is formed of the dielectric material such as SiC and SiOx, the tunnel layer 120 may have the thickness T120 of 0.5 nm to 2.5 nm.

For example, when the tunnel layer 120 is formed of SiOx, the thickness T120 of the tunnel layer 120 may be 0.8 nm to 1.2 nm. Further, when the tunnel layer 120 is formed of SiC, the thickness T120 of the tunnel layer 120 may be 0.5 nm to 2.5 nm.

This is described in detail below with reference to FIGS. 3 and 4.

In FIG. 3, (a) illustrates a band offset voltage between the semiconductor substrate 110 and the tunnel layer 120 when the tunnel layer 120 shown in FIGS. 1 and 2 is formed of SiOx, and (b) shows changes in a short circuit current Jsc and an open-circuit voltage Voc depending on the thickness T120 of the tunnel layer 120 shown in (a) of FIG. 3.

In FIG. 4, (a) illustrates a band offset voltage between the semiconductor substrate 110 and the tunnel layer 120 when the tunnel layer 120 shown in FIGS. 1 and 2 is formed of SiC; (b) illustrates a movement of electrons to the semiconductor substrate 110, the tunnel layer 120, and the back surface field regions 172 when the tunnel layer 120 is formed of SiC; and (C) illustrates a movement of holes to the semiconductor substrate 110, the tunnel layer 120, and the emitter regions 121 when the tunnel layer 120 is formed of SiC.

As shown in (a) of FIG. 3, when the tunnel layer 120 is formed of SiOx, a band offset voltage between the semiconductor substrate 110 and the tunnel layer 120 may relatively increase due to the properties of SiOx.

More specifically, a band offset voltage CBO of a valence band formed between the semiconductor substrate 110 and the tunnel layer 120 may be approximately 3.2 eV, and a band offset voltage VBO of a conduction band formed between the semiconductor substrate 110 and the tunnel layer 120 may be approximately 4.7 eV.

In this instance, as shown in (a) of FIG. 3, electrons produced in the semiconductor substrate 110 cannot jump the band offset voltage CBO of the valence band formed between the semiconductor substrate 110 and the tunnel layer 120 and can move to the back surface field regions 172 by passing through the tunnel layer 120.

Thus, as shown in (b) of FIG. 3, when the tunnel layer 120 is formed of SiOx, an amount of carriers passing through the tunnel layer 120 may rapidly decrease as indicated by an arrow, if the thickness T120 of the tunnel layer 120 does not satisfy the range of 0.8 nm to 1.2 nm. Further, the short circuit current Jsc may rapidly decrease.

As a result, a fill factor FF determined depending on the short circuit current Jsc and the open-circuit voltage Voc may be greatly reduced, and the efficiency of the solar cell may be reduced.

On the other hand, as shown in (a) of FIG. 4, when the tunnel layer 120 is formed of SiC, a band offset voltage between the semiconductor substrate 110 and the tunnel layer 120 may relatively decrease due to the properties of SiC.

More specifically, a band offset voltage VBO of a conduction band formed between the semiconductor substrate 110 and the tunnel layer 120 may be approximately 0.5 eV, and a band offset voltage CBO of a valence band formed between the semiconductor substrate 110 and the tunnel layer 120 may be approximately 0.9 eV.

Accordingly, as shown in (b) of FIG. 4, when the tunnel layer 120 is formed of SiC unlike (a) of FIG. 3 showing the tunnel layer 120 formed of SiOx, electrons moving from the semiconductor substrate 110 to the back surface field regions 172 can jump the band offset voltage VBO of the conduction band formed between the semiconductor substrate 110 and the tunnel layer 120 and can move to the back surface field regions 172, even if the thickness T120 of the tunnel layer 120 is 0.5 nm to 2.5 nm exceeding 0.8 nm to 1.2 nm. Further, as shown in (c) of FIG. 4, holes moving from the semiconductor substrate 110 to the emitter regions 121 can jump the band offset voltage CBO of the valence band formed between the semiconductor substrate 110 and the tunnel layer 120 and can move to the emitter regions 121.

In other words, when the tunnel layer 120 is formed of SiC, the short circuit current Jsc and the fill factor FF may be satisfactorily maintained even if the thickness T120 of the tunnel layer 120 is 0.5 nm to 2.5 nm exceeding 0.8 nm to 1.2 nm.

As a result, because a margin of the thickness T120 of the tunnel layer 120 may further increase, the process yield of the solar cell may be further improved while performing more easily the process for manufacturing the solar cell.

So far, the embodiment of the invention described that the semiconductor substrate 110, the front surface field region 171, and the back surface field regions 172 are doped with the first conductive type impurities, for example, the n-type impurities. However, in the following description, the embodiment of the invention is described using the p-type as an example of the first conductive type.

Figure 5:
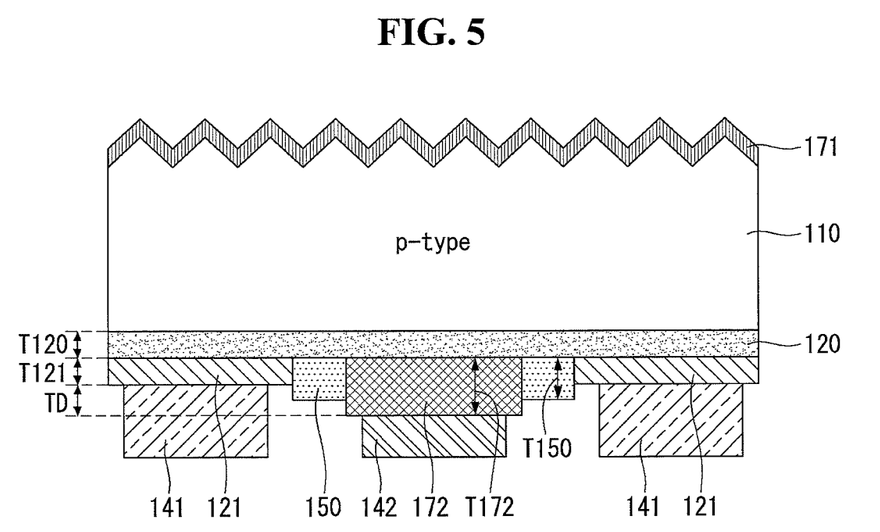
FIG. 5 illustrates a solar cell according to a second embodiment of the invention.

FIG. 5 illustrates a solar cell according to a second embodiment of the invention.

The description of structures and components identical or equivalent to those illustrated in the first embodiment of the invention is omitted in the second embodiment of the invention, and a difference therebetween is mainly described.

As shown in FIG. 5, the solar cell according to the second embodiment of the invention may include a semiconductor substrate 110, a front surface field region 171, a tunnel layer 120, an emitter region 121, a back surface field region 172, an intrinsic semiconductor layer 150, a first electrode 141, and a second electrode 142.

Conductive types of the semiconductor substrate 110, the front surface field region 171, the emitter region 121, and the back surface field region 172 in the second embodiment of the invention may be opposite to the conductive types of the semiconductor substrate 110, the front surface field region 171, the emitter region 121, and the back surface field region 172 in the first embodiment of the invention. Further, the thickness T121 of the emitter region 121 is greater than the thickness T172 of the back surface field region 172 in the first embodiment of the invention, but a thickness T121 of the emitter region 121 may be less than a thickness T172 of the back surface field region 172 in the second embodiment of the invention.

Since other descriptions have been already described in the first embodiment of the invention with reference to FIGS. 1 to 4, a further description may be briefly made or may be entirely omitted.

In the solar cell according to the second embodiment of the invention, a first conductive type of impurities doped on the semiconductor substrate 110, the front surface field region 171, and the back surface field region 172 may be a p-type, and a second conductive type of impurities doped on the emitter region 121 may be an n-type.

In this instance, in the method for manufacturing the solar cell according to the embodiment of the invention, the emitter region 121 mainly generating electrons is relatively etched more than the back surface field region 172 mainly generating holes. Hence, as shown in FIG. 5, the thickness T121 of the emitter region 121 may be less than the thickness T172 of the back surface field region 172.

As described above, a reason why the emitter region 121 mainly generating electrons is relatively etched more than the back surface field region 172 mainly generating holes is because an etchant including potassium hydroxide (KOH) and hydrogen peroxide ($H_2O_2$) has relatively high reactivity with respect to the electrons, but has relatively low reactivity with respect to the holes or has scarcely any reactivity with respect to the holes.

Even in this instance, a ratio of resistances of the front surface field region 171 and the back surface field region 172 may be 10:1 to 3:1. For example, the front surface field region 171 may have a resistance of 450 Ω to 900Ω per unit area, and the back surface field region 172 may have a resistance of 45Ω to 300Ω per unit area within the above range.

A thickness difference TD between the emitter region 121 and the back surface field region 172 may be 50 nm to 100 nm. In the second embodiment of the invention, the thickness T172 of the back surface field region 172 may be 200 nm to 300 nm, and the thickness T121 of the emitter region 121 may be 100 nm to 250 nm, unlike the first embodiment of the invention.

As shown in FIG. 5, the intrinsic semiconductor layer 150 may have a thickness T150 between the thickness T121 of the emitter region 121 and the thickness T172 of the back surface field region 172.

The tunnel layer 120 may be formed of a dielectric material, for example, SiC or SiOx. The tunnel layer 120 may have a thickness T120 of 0.5 nm to 2.5 nm.

So far, the embodiment of the invention described the structure and the effect of the solar cell capable of being implemented through the method for manufacturing the solar cell according to the embodiment of the invention. Hereinafter, the method for manufacturing the solar cell according to the embodiment of the invention is described in detail.

Figure 6:
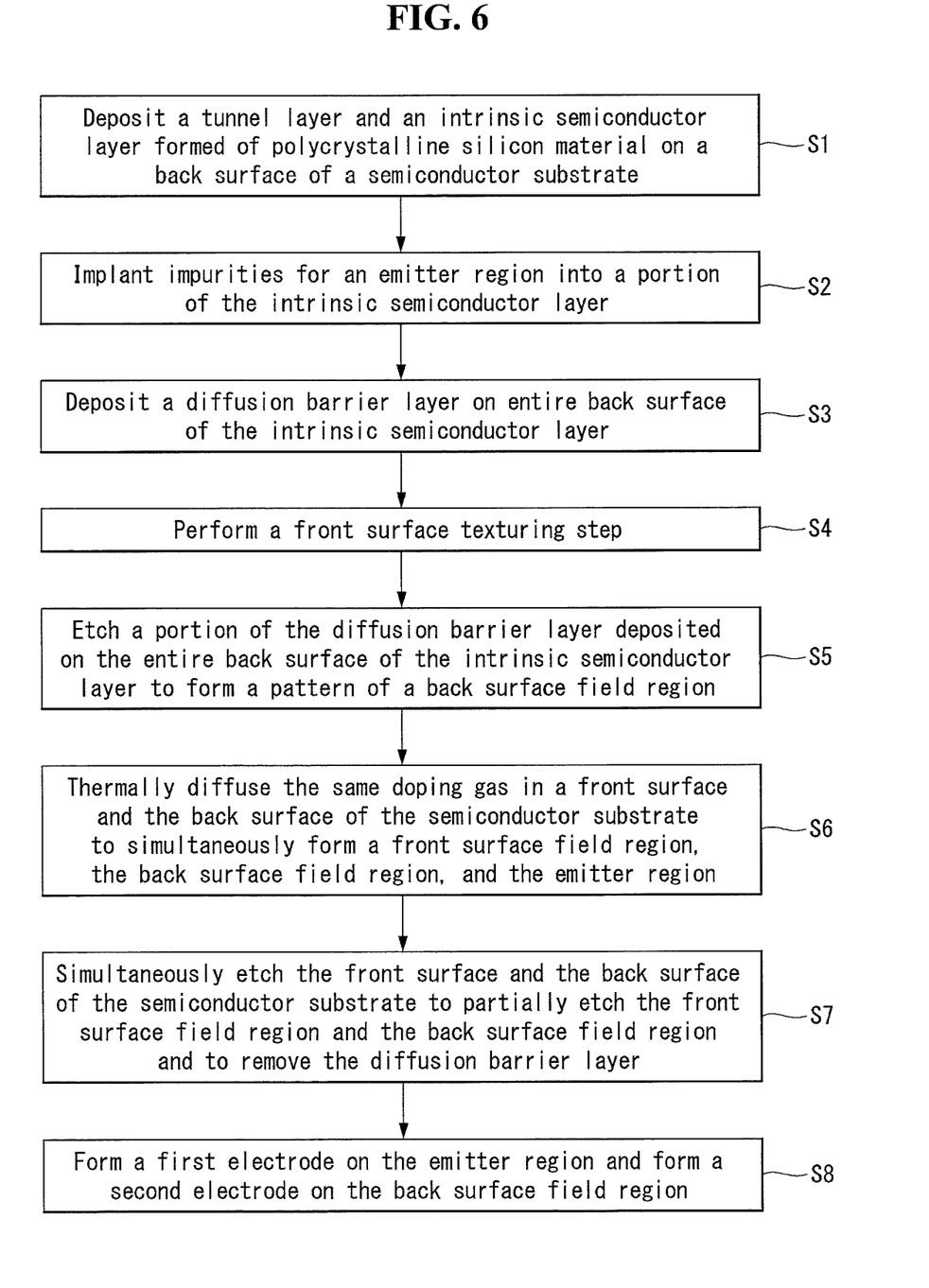
FIGS. 6 to 12 illustrate a method for manufacturing a solar cell according to an example embodiment of the invention.
Figure 7:
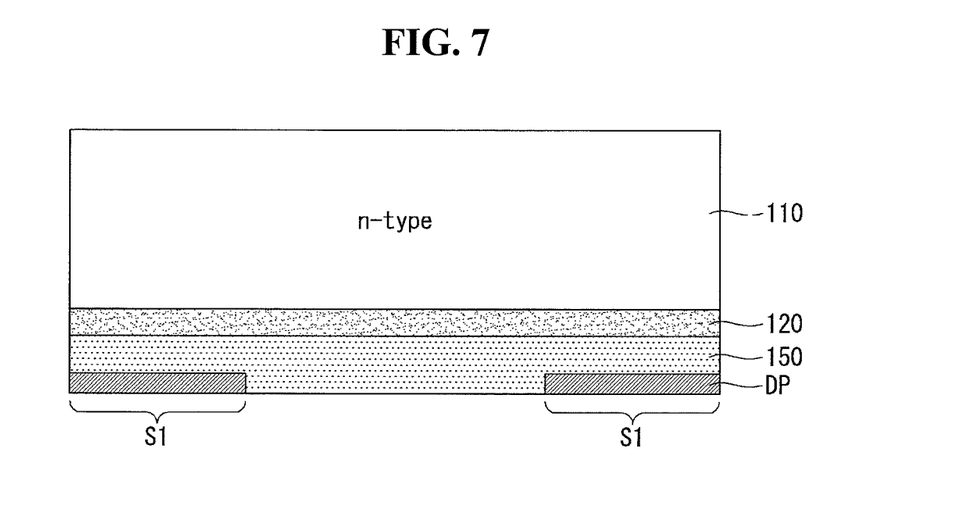
Figure 8:
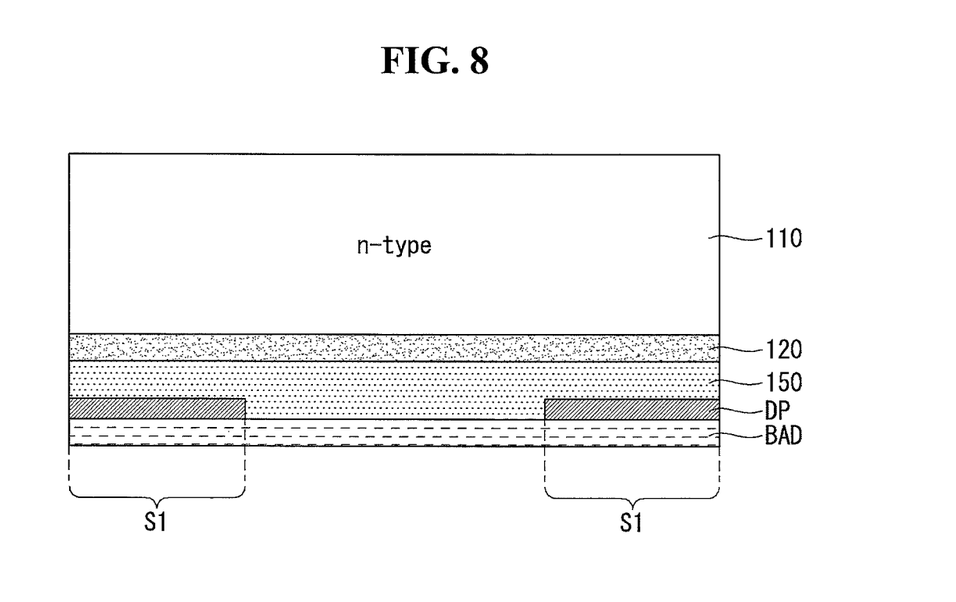
Figure 9:
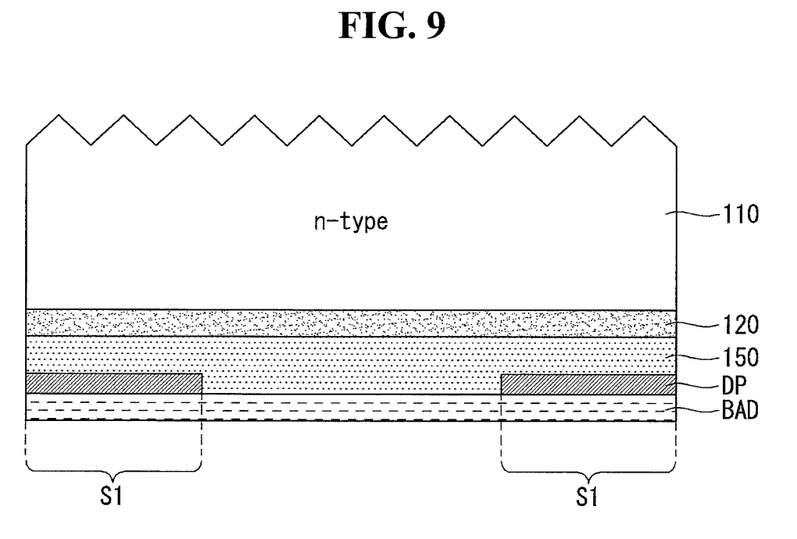
Figure 10:
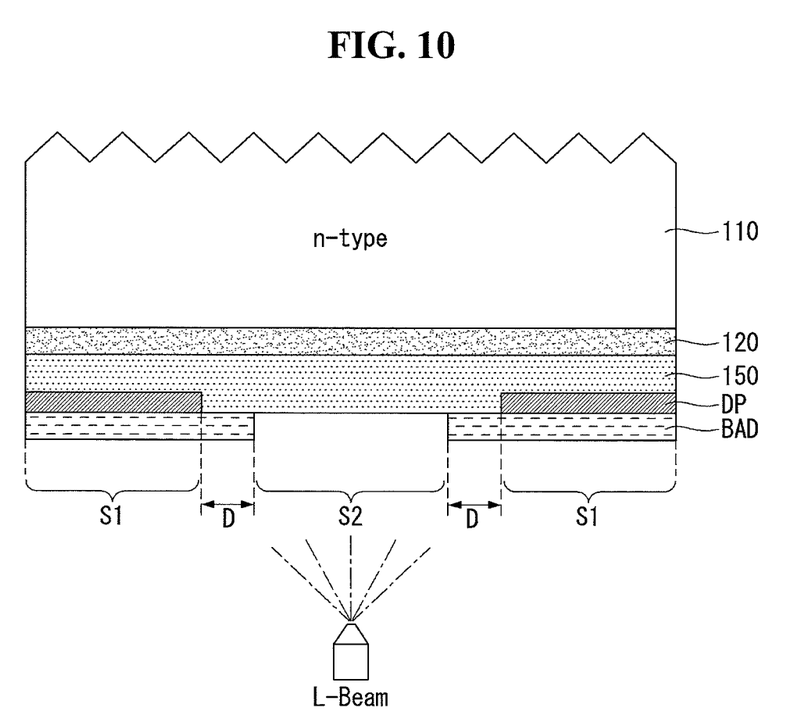
Figure 11:
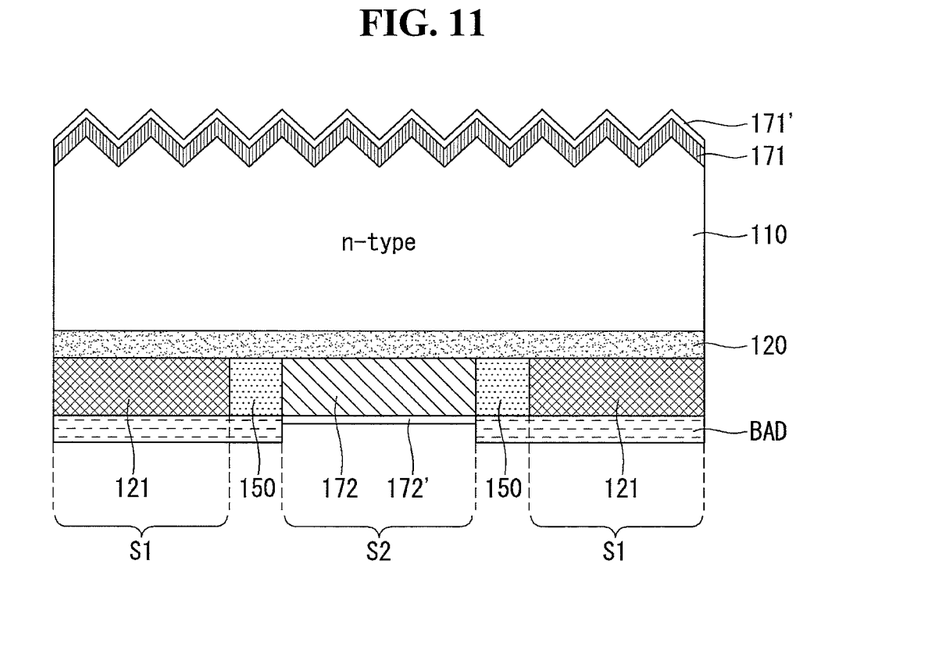
Figure 12:
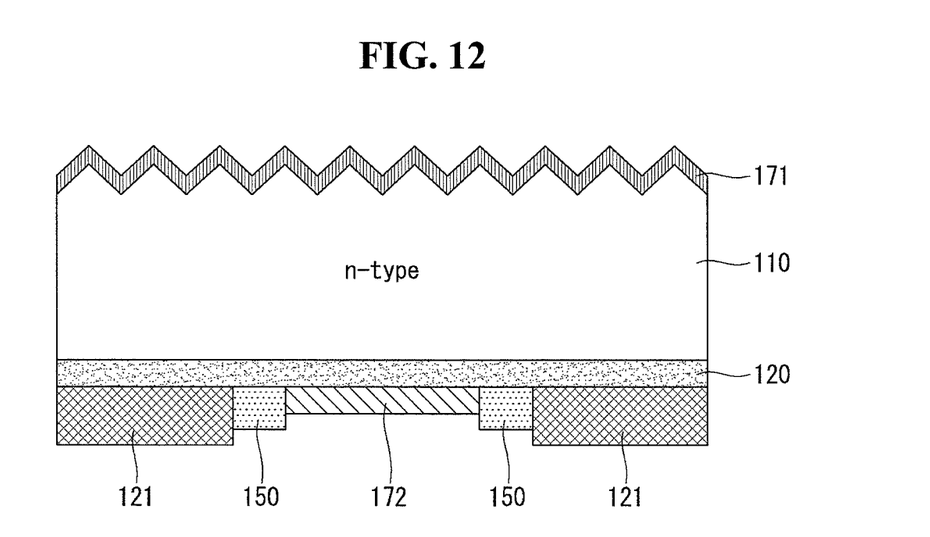

FIGS. 6 to 12 illustrate a method for manufacturing a solar cell according to the embodiment of the invention. More specifically, FIG. 6 is a flow chart showing an example of a method for manufacturing the solar cell shown in FIGS. 1 and 2. FIG. 7 illustrates in detail operation S1 and operation S2 shown in FIG. 6. FIG. 8 illustrates in detail operation S3 shown in FIG. 6. FIG. 9 illustrates in detail operation S4 shown in FIG. 6. FIG. 10 illustrates in detail operation S5 shown in FIG. 6. FIG. 11 illustrates in detail operation S6 shown in FIG. 6. FIG. 12 illustrates in detail operation S7 shown in FIG. 6.

As shown in FIG. 6, the method for manufacturing the solar cell according to the embodiment of the invention may include a deposition operation S1 of the tunnel layer 120 and the intrinsic semiconductor layer 150, an impurity implantation operation S2, formation operations S3 and S5 of a diffusion barrier layer, a front surface texturing operation S4, a thermal diffusion operation S6, an etching operation S7, and an electrode formation operation S8.

The front surface texturing operation S4 may be omitted in the method for manufacturing the solar cell according to the embodiment of the invention. However, when the front surface texturing operation S4 is performed, a reflection of light incident on the semiconductor substrate 110 may be minimized. Therefore, the embodiment of the invention describes the method for manufacturing the solar cell including the front surface texturing operation S4, as an example.

Referring to FIGS. 6 and 7, in the deposition operation S1 of the tunnel layer 120 and the intrinsic semiconductor layer 150, the tunnel layer 120 formed of a dielectric material may be deposited on the entire back surface of the semiconductor substrate 110 formed of single crystal silicon material containing impurities of a first conductive type.

More specifically, the tunnel layer 120 deposited on the entire back surface of the semiconductor substrate 110 may be formed of the dielectric material, for example, SiC or SiOx, as described above. The tunnel layer 120 may be deposited at a thickness of 0.5 nm to 2.5 nm.

Characteristics of the tunnel layer 120 scarcely change at a high temperature. The tunnel layer 120 may prevent impurities of the first conductive type or a second conductive type thermally diffused into the intrinsic semiconductor layer 150 from being diffused into the semiconductor substrate 110 in the subsequent thermal diffusion operation S6.

After the tunnel layer 120 is deposited, the intrinsic semiconductor layer 150 formed of polycrystalline silicon material may be deposited on the back surface of the tunnel layer 120.

The intrinsic semiconductor layer 150 may be deposited at a thickness of about 200 nm to 300 nm. A low pressure chemical vapor deposition (LPCVD) method may be used to deposit the intrinsic semiconductor layer 150. A temperature of a deposition process for the intrinsic semiconductor layer 150 may be approximately 600° C. to 650° C.

Next, in the impurity implantation operation S2, as shown in FIG. 7, impurities of the second conductive type opposite the first conductive type may be implanted into a first area S1 of the intrinsic semiconductor layer 150, so as to form the emitter region 121 containing impurities of the second conductive type at a portion of the intrinsic semiconductor layer 150.

For example, if the first conductive type is the n-type and the second conductive type is the p-type, the impurities of the second conductive type implanted into the first area S1 of the intrinsic semiconductor layer 150 in the impurity implantation operation S2 may be boron (B).

When the impurities of the second conductive type are implanted, the impurities of the second conductive type may be separated into a plurality of parts and may extend in a predetermined direction. Hence, the first area S1 of the intrinsic semiconductor layer 150, into which the impurities of the second conductive type are implanted, may be the same as a pattern of the emitter region 121 shown in FIGS. 1 and 2.

A portion DP of the intrinsic semiconductor layer 150, into which the impurities of the second conductive type are implanted, may be formed as the emitter region 121 in a subsequent process.

After the impurity implantation operation S2 is completed, the formation operations S3 and S5 of the diffusion barrier layer may be performed as shown in FIG. 6.

The diffusion barrier layer formation operations S3 and S5 may include forming a diffusion barrier layer BAD on the first area S1 of the intrinsic semiconductor layer 150, into which the impurities of the second conductive type are implanted.

For this, as shown in FIG. 6, the diffusion barrier layer formation operations S3 and S5 may include a diffusion barrier layer deposition operation S3 and a back surface field region pattern formation operation S5. The front surface texturing operation S4 may be additionally performed between the diffusion barrier layer deposition operation S3 and the back surface field region pattern formation operation S5.

As shown in FIG. 8, in the diffusion barrier layer deposition operation S3, the diffusion barrier layer BAD includes the first area S1 of the intrinsic semiconductor layer 150 and may be deposited on the entire back surface of the intrinsic semiconductor layer 150.

Namely, in the diffusion barrier layer deposition operation S3, the diffusion barrier layer BAD may be deposited on the entire back surface of the intrinsic semiconductor layer 150, so that the diffusion barrier layer BAD covers not only the first area S1 of the intrinsic semiconductor layer 150, into which the impurities of the second conductive type are implanted, but also a portion of the intrinsic semiconductor layer 150, into which the impurities of the second conductive type are not implanted.

The diffusion barrier layer BAD may be formed of silicon carbide (SiC). Silicon carbide (SiC) is characterized in that it is very easily etched by a laser beam, has strong resistance to high temperature, and does not react on an etchant including potassium hydroxide (KOH) used to etch the silicon material in the front surface texturing operation S4.

Accordingly, after the diffusion barrier layer BAD is deposited on the entire back surface of the intrinsic semiconductor layer 150 as shown in FIG. 8, the front surface texturing operation S4 for forming a plurality of uneven portions may be performed on the front surface of the semiconductor substrate 110 as shown in FIG. 9.

The front surface texturing operation S4 may be performed by immersing the semiconductor substrate 110 in the etchant. In this instance, the back surface of the semiconductor substrate 110, on which the diffusion barrier layer BAD is formed, is not etched, and only the front surface of the semiconductor substrate 110 may be etched.

Because the semiconductor substrate 110 is formed of single crystal silicon material, the uneven portions having, for example, a pyramid shape may be formed on the front surface of the semiconductor substrate 110.

After the front surface texturing operation S4 is completed, the back surface field region pattern formation operation S5 may be performed as shown in FIG. 6.

As shown in FIG. 10, the back surface field region pattern formation operation S5 may etch the diffusion barrier layer BAD formed on a second area S2 excluding the first area S1 from the intrinsic semiconductor layer 150 and may form a pattern for forming the back surface field region 172 on the diffusion barrier layer BAD.

As shown in FIG. 10, the first area S1 of the intrinsic semiconductor layer 150, into which the impurities of the second conductive type are implanted, and the second area S2 of the intrinsic semiconductor layer 150, in which the diffusion barrier layer BAD is etched, may be separated from by a distance D.

Namely, as shown in FIG. 10, the diffusion barrier layer BAD deposited on the second area S2 of the intrinsic semiconductor layer 150 may be etched, so that the diffusion barrier layer BAD is formed more widely than the first area S1 of the intrinsic semiconductor layer 150, into which the impurities of the second conductive type are implanted. Hence, when viewed from the back surface of the semiconductor substrate 110, the first area S1 and the second area S2 of the intrinsic semiconductor layer 150 do not overlap each other and may be separated from each other.

As describe above, the back surface field region pattern formation operation S5 may be performed by irradiating the laser beam onto the diffusion barrier layer BAD deposited on the second area S2 of the intrinsic semiconductor layer 150. Namely, as shown in FIG. 10, the diffusion barrier layer BAD deposited on the second area S2 of the intrinsic semiconductor layer 150 may be etched and removed by irradiating the laser beam onto the diffusion barrier layer BAD formed of silicon carbide (SiC).

Afterwards, the thermal diffusion operation S6 may be performed as shown in FIG. 6.

The thermal diffusion operation S6 may simultaneously form the front surface field region 171, the back surface field region 172, and the emitter region 121 by thermally diffusing the same doping source into the front surface and the back surface of the semiconductor substrate 110.

In other words, in the thermal diffusion operation S6, a doping source containing impurities of the first conductive type may be simultaneously diffused in the front surface of the semiconductor substrate 110 and the second area S2 of the intrinsic semiconductor layer 150 deposited on the back surface of the semiconductor substrate 110, in which the diffusion barrier layer BAD is etched and removed (namely, the diffusion barrier layer BAD is not formed). Hence, as shown in FIG. 11, the front surface field region 171 formed of single crystal silicon material may be formed at the front surface of the semiconductor substrate 110, and at the same time the back surface field region 172 and the emitter region 121 formed of polycrystalline silicon material may be formed at the intrinsic semiconductor layer 150 deposited on the back surface of the semiconductor substrate 110.

More specifically, as shown in FIG. 10, the thermal diffusion operation S6 may dispose the semiconductor substrate 110, on which the diffusion barrier layer BAD is formed, in the chamber and may apply heat to the chamber while injecting $POCl_2$ gas (as the doping source) containing phosphorus (P) as an example of impurities of the first conductive type into the chamber, thereby thermally diffusing phosphorus (P) as the impurities of the first conductive type in the front surface of the semiconductor substrate 110 and at the same time thermally diffusing phosphorus (P) in the second area S2 of the intrinsic semiconductor layer 150 deposited on the back surface of the semiconductor substrate 110.

Hence, the front surface field region 171 may be formed at the front surface of the semiconductor substrate 110, and the back surface field region 172 may be formed inside the second area S2 of the intrinsic semiconductor layer 150.

Further, in the thermal diffusion operation S6, boron (B) as an example of impurities of the second conductive type, which has been previously implanted into the first area S1 of the intrinsic semiconductor layer 150, may be thermally diffused and activated inside the intrinsic semiconductor layer 150. Hence, the emitter region 121 formed of polycrystalline silicon material may be formed in the first area S1 of the intrinsic semiconductor layer 150.

A space between the first area S1 and the second area S2 of the intrinsic semiconductor layer 150 is not doped with the impurities of the first and second conductive types.

In the thermal diffusion operation S6, the diffusion barrier layer BAD formed of silicon carbide (SiC) may be oxidized to silicon oxide (SiOx) by oxygen (O) included in $POCl_2$ gas as the doping source. For reference, it is not easy to remove silicon carbide (SiC), but silicon oxide (SiOx) may be easily removed using an etchant used in the subsequent etching operation.

In the thermal diffusion operation S6, by-products 171' and 172', for example, phosphosilicate glass (PSG) may be formed at the surface of the front surface field region 171 and the surface of the back surface field region 172. In the embodiment of the invention, because the first conductive type is the n-type and the second conductive type is the p-type, phosphosilicate glass (PSG) is formed as an example of the by-products 171' and 172'. On the contrary, the first conductive type is the p-type and the second conductive type is the n-type, borosilicate glass (BSG) may be formed as an example of the by-products 171' and 172'.

After the thermal diffusion operation S6, the diffusion barrier layer BAD oxidized to silicon oxide (SiOx) and the by-products 171' and 172' may be removed in the etching operation S7.

More specifically, the semiconductor substrate 110 going through until the thermal diffusion operation S6 may be completely immersed in the etchant including potassium hydroxide (KOH) and hydrogen peroxide ($H_2O_2$). Hence, the front surface and the back surface of the semiconductor substrate 110 may be simultaneously etched.

In the etching operation S7, the surface of the front surface field region 171 and the surface of the back surface field region 172 may be partially etched, and at the same time the diffusion barrier layer BAD of silicon oxide (SiOx) formed on the emitter region 121 may be removed.

Hence, the by-products 171' and 172', namely, PSG or BSG formed at the front surface field region 171 and the back surface field region 172 in the thermal diffusion operation S6 may be removed in the etching operation S7.

In the etching operation S7, an etching rate of the front surface field region 171 formed of the single crystal silicon material, an etching rate of the emitter region 121 formed of the polycrystalline silicon material and the back surface field region 172 formed of the polycrystalline silicon material, and an etching rate of the intrinsic semiconductor layer 150, which is not doped with impurities, may be different from one another.

More specifically, in the etching operation S7, the etching rate of the front surface field region 171 may be greater than the etching rate of the back surface field region 172.

This may be because of the characteristics of silicon material included in the front surface field region 171 and the back surface field region 172. Namely, because the etchant including potassium hydroxide (KOH) and hydrogen peroxide ($H_2O_2$) used in the etching operation S7 may etch the single crystal silicon material having a single crystal structure more than the polycrystalline silicon material, the etching rate of the front surface field region 171 formed of the single crystal silicon material may be greater than the etching rate of the back surface field region 172 formed of the polycrystalline silicon material.

In other words, the front surface field region 171 may be etched more than the back surface field region 172 for the same etching time, and thus an etched thickness of the front surface field region 171 may be greater than an etched thickness of the back surface field region 172.

Hence, an amount of first conductive type impurities of the front surface field region 171 may be less than an amount of first conductive type impurities of the back surface field region 172, and a resistance of the front surface field region 171 may be greater than a resistance of the back surface field region 172.

As a result of the etching operation S7, a ratio of resistances of the front surface field region 171 and the back surface field region 172 may be obtained as 10:1 to 3:1. Since, the effect obtained by the resistance ratio was described above, a further description is omitted.

Further, as shown in FIG. 12, as a result of the etching operation S7, the thickness T121 of the emitter region 121 may be different from the thickness T172 of the back surface field region 172.

This is because the etchant including potassium hydroxide (KOH) and hydrogen peroxide ($H_2O_2$) used in the etching operation S7 has relatively high reactivity with respect to electrons, but has relatively low reactivity with respect to holes or has scarcely any reactivity with respect to the holes.

More specifically, when the first conductive type is the n-type, the emitter region 121 is of the p-type and the back surface field region 172 is of the n-type. In this instance, holes mainly exist in the emitter region 121, and electrons mainly exist in the back surface field region 172. Because the etchant has relatively high reactivity with respect to electrons, the etchant etches the back surface field region 172 more than the emitter region 121.

As a result of the etching operation S7, the thickness T172 of the back surface field region 172 may be less than the thickness T121 of the emitter region 121. Since the thickness T121 of the emitter region 121 or the thickness T172 of the back surface field region 172 formed after the etching operation S7 was described above with reference to FIGS. 1 to 5, a further description is omitted.

Unlike the embodiment of the invention, if the first conductive type is the p-type, the emitter region 121 may be of the n-type and the back surface field region 172 may be of the p-type. Thus, the thickness T121 of the emitter region 121 may be less than the thickness T172 of the back surface field region 172 as a result of the etching operation S7.

Because the intrinsic semiconductor layer 150 is not doped with impurities of any conductive type, the intrinsic semiconductor layer 150 may be etched more than the emitter region 121 and may be etched less than the back surface field region 172 when the first conductive type is the n-type. Hence, as shown in FIG. 12, as a result of the etching operation S7, the thickness T150 of the intrinsic semiconductor layer 150 may be less than the thickness T121 of the emitter region 121 and may be greater than the thickness T172 of the back surface field region 172.

On the contrary, if the first conductive type is the p-type, the intrinsic semiconductor layer 150 may be etched more than the back surface field region 172 and may be etched less than the emitter region 121. Hence, unlike FIG. 12, the thickness T150 of the intrinsic semiconductor layer 150 may be greater than the thickness T121 of the emitter region 121 and may be less than the thickness T172 of the back surface field region 172.

Accordingly, the thickness T150 of the intrinsic semiconductor layer 150 may have a value between the thickness T121 of the emitter region 121 and the thickness T172 of the back surface field region 172 irrespective of the n-type or the p-type of the first conductive type.

Next, as shown in FIG. 6, the electrode formation operation S8 is performed to form the first electrode 141 on the emitter region 121 and to form the second electrode 142 on the back surface field region 172. As a result, the solar cell shown in FIGS. 1 and 2 may be completed.

The method for manufacturing the solar cell according to the embodiment of the invention may be simplified by forming the front surface field region 171 and the back surface field region 172 using the same doping source in the thermal diffusion operation S6 and at the same time forming the emitter region 121 in the thermal diffusion operation S6.

The method for manufacturing the solar cell according to the embodiment of the invention may be further simplified by simultaneously etching the front surface and the back surface of the semiconductor substrate 110 after the thermal diffusion operation S6 and simultaneously removing the by-products formed at the surface of the front surface field region 171 and the surface of the back surface field region 172 while removing the diffusion barrier layer BAD formed on the emitter region 121.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a solar cell, the method comprising:
   depositing a tunnel layer formed of a dielectric material on an entire back surface of a semiconductor substrate containing impurities of a first conductive type;
   depositing an intrinsic semiconductor layer on an entire back surface of the tunnel layer;
   implanting impurities of a second conductive type opposite the first conductive type into a first area of the intrinsic semiconductor layer, the first area of the intrinsic semiconductor area being a part of the intrinsic semiconductor layer;
   forming a SiC layer on an entire back surface of the intrinsic semiconductor layer;
   texturing a front surface of the semiconductor substrate using the SiC layer as a mask;
   removing a portion of the SiC layer by a laser, such that the SiC layer covers the first area and the portion of the intrinsic semiconductor layer except for a second area, wherein the portion of the intrinsic layer is disposed between the first area and the second area;
   performing a thermal diffusion operation for thermally diffusing a doping source containing impurities of the first conductive type in the second area of the intrinsic semiconductor layer and in the front surface of the semiconductor substrate at the same time using the SiC layer as a mask, wherein the SiC layer is converted into a SiOx layer during the thermal diffusion operation; and
   removing the SiOx layer,
   wherein a front surface field region at the front surface of the semiconductor substrate and a back surface field region at the second area of the intrinsic semiconductor layer and an emitter region at the first area of the intrinsic semiconductor layer are simultaneously formed by the thermal diffusion operation.

2. The method of claim 1, wherein the first area of the intrinsic semiconductor layer and the second area of the intrinsic semiconductor layer are separated from each other.

3. The method of claim 1, wherein the emitter region is formed of polycrystalline silicon material in the diffusion operation.

4. The method of claim 1, wherein a by-product being one of phosphosilicate glass (PSG) or borosilicate glass (BSG) generated in the front surface field region and the back surface field region in the thermal diffusion operation is removed from the front surface field region and the back surface field region in the removing of the SiOx layer.

5. The method of claim 4, wherein in the removing of the SiOx layer, the front surface field region, the back surface field region and the emitter region are simultaneously etched, and an etching rate of the front surface field region is greater than an etching rate of the back surface field region.

6. The method of claim 1, wherein a ratio of sheet resistances of the front surface field region and the back surface field region after the removing of the SiOx layer is 10:1 to 3:1.

7. The method of claim 1, wherein a thickness of the back surface field region is less than the thickness of the emitter region.

8. The method of claim 1, wherein a thickness of the portion of the intrinsic semiconductor layer is greater than a thickness of the back surface field region and less than a thickness of the emitter region.

9. The method of claim 1, wherein, in the implanting of impurities of the second conductive type opposite the first conductive type into the first area of the intrinsic semiconductor layer, the impurities of the second conductive type is implanted into a certain depth of the intrinsic semiconductor layer so that a portion of the first area of the intrinsic semiconductor layer is without the impurities of the second conductive type.

10. The method of claim 1, wherein an etchant used in the removing of the SiOx layer includes potassium hydroxide (KOH) and hydrogen peroxide ($H_2O_2$), and
   a thickness of the emitter region and a thickness of the back surface field region are formed differently from each other during the removing of the SiOx layer.

* * * * *